(12) United States Patent
Feng et al.

(10) Patent No.: US 9,093,925 B2
(45) Date of Patent: Jul. 28, 2015

(54) SWITCHED CAPACITOR CHARGE PUMP DRIVER FOR PIEZOELECTRIC ACTUATOR

(75) Inventors: Zhihua Feng, Hefei (CN); Yuting Ma, Hefei (CN); Liang Huang, Hefei (CN); Yongbin Liu, Hefei (CN); Weiwei Shao, Hefei (CN)

(73) Assignee: University of Science and Technology of China, Hefei, Anhui (CN)

( * ) Notice: Subject to any disclaimer, the term of this patent is extended or adjusted under 35 U.S.C. 154(b) by 0 days.

(21) Appl. No.: 13/145,397

(22) PCT Filed: May 3, 2011

(86) PCT No.: PCT/CN2011/073617
§ 371 (c)(1),
(2), (4) Date: Jul. 20, 2011

(87) PCT Pub. No.: WO2012/149676
PCT Pub. Date: Nov. 8, 2012

(65) Prior Publication Data
US 2014/0062346 A1    Mar. 6, 2014

(51) Int. Cl.
*H02N 2/00* (2006.01)
*H01L 41/04* (2006.01)

(52) U.S. Cl.
CPC ............ *H02N 2/0075* (2013.01); *H01L 41/042* (2013.01)

(58) Field of Classification Search
CPC ......... H01L 41/042; H02N 2/025; H02N 2/14
USPC .......................................... 310/317; 318/116
See application file for complete search history.

(56) References Cited

U.S. PATENT DOCUMENTS

| | | | |
|---|---|---|---|
| 4,263,527 | A | 4/1981 | Comstock |
| 4,550,295 | A | 10/1985 | Sasaki |

(Continued)

FOREIGN PATENT DOCUMENTS

| | | |
|---|---|---|
| CN | 101741242 A | 6/2010 |
| CN | 101764518 A | 6/2010 |
| CN | 1020025339 A | 4/2011 |

OTHER PUBLICATIONS

Huang L, et al., *Switched Capacitor Charge Pump Reduced Hysteresis of Piezoelectric Actuatos Over a Large Frequency Range*, Review of Scientific Instruments 81,094701(2010); American Institute of Physics, pp. 094701-1 to 0947017, published online Sep. 3, 2010.

(Continued)

*Primary Examiner* — Derek Rosenau
*Assistant Examiner* — Bryan Gordon
(74) *Attorney, Agent, or Firm* — Wolf, Greenfield & Sacks, P.C.

(57) ABSTRACT

A switched capacitor charge pump driver for piezoelectric actuator includes a power source, a first switching capacitor and a piezoelectric actuating circuit, wherein during being at a first state, the first capacitor is charged by the power source; during being at a second state, the first capacitor is discharged to the piezoelectric actuator in the actuating circuit. The switched capacitor charge pump driver for piezoelectric actuator can expand the application of charge controller to a broader frequency range, especially at low frequencies and effectively decrease the hysteresis of piezoelectric stack over a large frequency range even at a quasistatic state. In addition, a method for driving piezoelectric actuator by a switched capacitor charge pump is provided.

22 Claims, 5 Drawing Sheets

(56) References Cited

U.S. PATENT DOCUMENTS

| | | | |
|---|---|---|---|
| 4,608,506 A | 8/1986 | Tanuma | |
| 4,841,191 A | 6/1989 | Takada et al. | |
| 5,493,543 A * | 2/1996 | Kamens | 368/255 |
| 6,323,730 B1 * | 11/2001 | Hynd | 330/85 |
| 7,119,622 B2 * | 10/2006 | Sato | 330/296 |
| 7,535,281 B2 | 5/2009 | Olsen | |
| 2003/0094882 A1 * | 5/2003 | Mizuuchi | 310/317 |
| 2003/0099233 A1 | 5/2003 | Bae et al. | |
| 2004/0046484 A1 * | 3/2004 | Schiller | 310/317 |
| 2010/0001618 A1 * | 1/2010 | Fukagawa et al. | 310/317 |
| 2010/0026139 A1 * | 2/2010 | Yoshida | 310/317 |

OTHER PUBLICATIONS

Ma, Yu Ting, et al., *Note:Creep Character of Piezoelectric Actuator Under Switched Capacitor Charge Pump Control*, Review of Scientific Instruments, 82,046106(2011); American Institute of Physics, pp. 046106-1 to 046106-3, published online Apr. 13, 2011.

Ma, Yu Ting, et al., *Charge Pump Controller for Grounded Piezoelectric Actuators Used in Precise Positioning*, Electronics Letters 2011, vol. 47, No. 15; pp. 440-443, Jul. 21, 2011.

Kaizuka, H. et al., *A Simple Way to Reduce Hysteresis and Creep When Using Piezoelectric Actuators*, Jpn. J. Appl. Phys., Part 2 27, 773 (1988); pp. L773-L776.

Furutani, K. et al., *A Driving Method of Piezoelectric Actuator by Using Current Pulses*, Meas. Sci. Technol. 17, (2006); pp. 2387-2394.

Fleming, A. J. et al., *A Grounded-Load Charge Amplifier for Reducing Hysteresis in Piezoelectric Tube Scanners*, Rev. Sci. Instrum.76, 073707 (2005); pp. 0737-7-1 to 073707-5.

Ru C. et al, *A New Amplifier for Improving Piezoelectric Actuator Linearity Based on Current Switching in Precision Positioning*, Meas. Sci. Technol. 19, 015203 (2008); pp. 1-7.

Nilchi A., et al, *Charge-Pump Based Switched-Capacitor Integrator for SD Modulators, Electronics Letters*, Mar. 18, 2010 V.46, No. 6; 2 pages.

Yi K.A. et al., *A Charge Controller for Linear Operation of a Piezoelectric Stack Actuator*, IEEE Trans. Control Syst. Technol. 13,(2005); pp. 517-526.

Newcomb, C.V. et al., *Improving the Linearity of Piezoelectric Ceramic Actuaors*, Electronics Letters vol. 18, May 27, 1982; pp. 442-444.

International Search Report and Written Opinion dated Feb. 16, 2012 from corresponding International Application No. PCT/CN2011/073617.

* cited by examiner

SWITCHED CAPACITOR CHARGE PUMP DRIVER FOR PIEZOELECTRIC ACTUATOR

FIELD OF THE INVENTION

The present invention relates to driver for piezoelectric actuators, and in particular to switched capacitor charge pump driver for piezoelectric actuator.

BACKGROUND OF THE INVENTION

Piezoelectric actuators have been widely used for precise multidimensional positioning from subnanometer to micrometer scale due to their high stiffness, compact size, and high dynamic responses. The piezoelectric material is subject to dielectric hysteresis resulting in a nonlinear relationship between the applied voltage and the output mechanical displacement. Some approaches have been used to overcome the hysteresis, including feed forward control using inverse model of hysteresis, such as the Preisach model, domain wall theory and homogenized energy model. However, these models have shortcomings of being sophisticated, lack of robustness, plant parameter uncertainty, and being computationally cumbersome. Other approaches, including feedback of displacement control and feedback of induced charge, are limited by high cost or poor sensor performance.

Figure 1A:
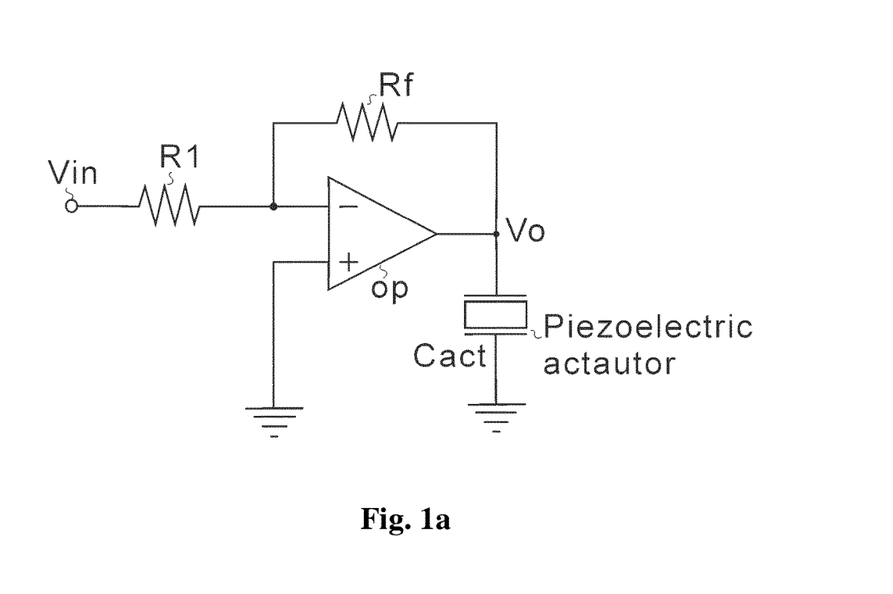
FIG 1a shows a schematic diagram of a configuration of an existing voltage amplifier.

The basic configuration of the traditional voltage control circuit is shown in FIG 1a. The piezoelectric actuator is modeled as a capacitor $C_{act}$. The voltage controller is an inverting amplifier, which magnifiers the input voltage to drive the piezoelectric actuator.

Figure 1B:
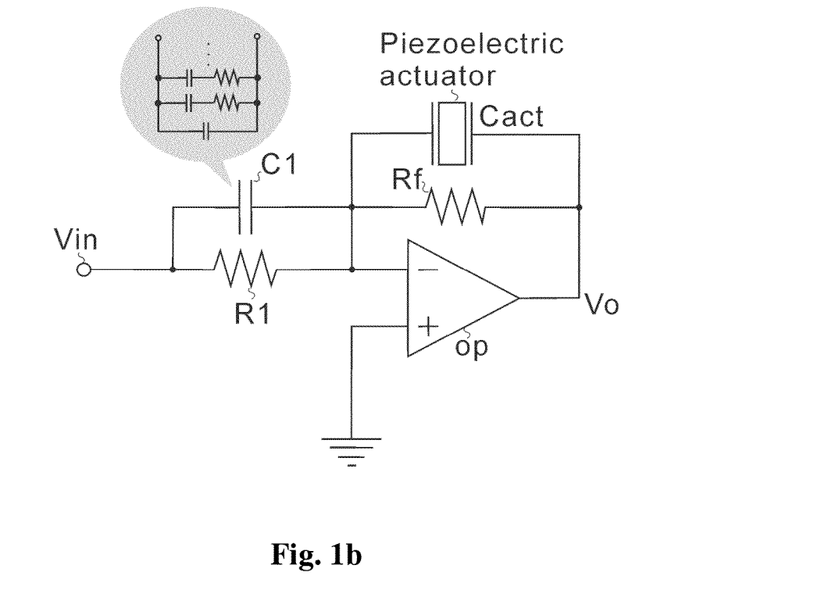
FIG 1b shows a schematic diagram of a configuration of an existing charge amplifier.

The basic configuration of the traditional charge amplifier is shown in FIG 1b. In FIG 1b, the charge controller is an inverting amplifier, which magnifies and converts the input voltage to proportional charges on the actuator at high frequencies.

Assuming that both the actuator and the input capacitor are initially discharged and the op-amp is ideal, in FIG 1a, the driving voltage exerted on the piezoelectric actuator is presented as $$V_o = -\frac{R_f}{R_1}V_{in}. \quad (1)$$

In FIG 1b, supposing the input capacitor $C_1$ is ideal, the driving voltage can be expressed as $$V_o(j\omega) = -\frac{R_f}{R_1}\frac{R_1 C_1 j\omega + 1}{R_f C_{act} j\omega}V_{in}(j\omega). \quad (2)$$

Assuming that $$R_1 C_1 = R_f C_{act}, \quad (3)$$

then the voltage gain is a constant and independent of frequency. The amplifier can be viewed as a concatenation of the voltage and charge amplifiers. For input frequencies $\omega \ll 1/R_1 C_1$, the capacitances are negligible, and as such, the resistances determine the transfer function as $$V_o = -\frac{R_f}{R_1}V_{in}, \quad (4)$$

which is the same as expression (1). In this case, the voltage $V_o$ on the actuator is proportional to the input voltage $V_{in}$, and the circuit operates as a voltage controller. Therefore, at low frequencies, the hysteresis of the actuator causes nonlinear operation. On the other hand, for input frequencies $\omega \gg 1/R_1 C_1$, the resistances are negligible. Thus, the capacitances determine the actuator voltage according to $$V_0 = -\frac{C_1}{C_{act}}V_{in} = \frac{Q_{act}}{C_{act}}, \quad (5)$$

and as such, the circuit acts as a charge controller. Therefore, at high frequencies, the actuator has good linear characteristics. It should be noted that $V_o$ is not proportional to $V_{in}$, given that the equivalent actuator capacitance changes nonlinearly with the voltage applied on it. If $R_1$ and $R_f$ are infinitely large, the charges on the capacitor $C_1$ can be transferred totally to the piezoelectric actuator at relatively low frequencies. In this case, the quantity of the charges delivered to the actuator is linear with the input voltage $V_{in}$, and the charge in the $C_{act}$ has no influence on actuator performance.

The above described expressions are based on the presumption that the input capacitor is ideal. In this charge controller, a capacitor with a much larger capacitance than the actuator is required to ensure proper operation of the circuit. However, a large capacitor usually has large dielectric absorption, indicating that the input capacitor C1 is not a pure capacitor but one with nonignorable resistance component, as shown in the inset of FIG 1b.

Therefore, for existing charge driver, the two factors that may influence its performances are the resistor network and the dielectric absorption of the input capacitor. It is not a charge driving system and has inevitable influence on the performance of the actuators. The existence of the resistor network worsens displacement linearity at low frequencies, while the dielectric absorption causes nonlinear displacement response over all the frequency ranges.

SUMMARY OF THE INVENTION

For the technical problems mentioned above, the invention provides a switched capacitor charge pump driver for piezoelectric actuator including: a power source, a first switching capacitor and a piezoelectric actuating circuit, wherein when being at a first state, the first switching capacitor is connected with the power source and charged by the power source; and when being at a second state, the first switching capacitor is connected with the piezoelectric actuating circuit and discharged to the piezoelectric actuating circuit.

Preferably, the piezoelectric actuating circuit includes a first operational amplifier, the non-inverting input terminal thereof being connected to ground; and a piezoelectric actuator connected between the inverting input terminal and the output terminal of the first operational amplifier.

Preferably, the first switching capacitor includes:
a first switching means; and
a first capacitor connected between the first switching means and the ground,
wherein when the first switching capacitor is at the first state, the first switching means is at a first position and connects the first capacitor to a power source; and when the first switching capacitor is at the second state, the first switching means is at a second position and connects the first capacitor to the inverting input of the first operational amplifier.

Preferably, the power source comprises:
a positive voltage source for providing a positive voltage;
a negative voltage source for providing a negative voltage; and
a second switching means connected the positive voltage source to the first switching capacitor when the second switching means is at a first position, and connected the negative voltage source to the first switching capacitor when the second switching means is at a second position.

Preferably, a second switching capacitor is provided in parallel with the first switching capacitor.

Preferably, the second switching capacitor includes:
a third switching means; and
a second capacitor connected between the third switching means and the ground,
wherein the third switching means connects the second switching capacitor to the power source when the third switching means is at a first position, and connects the second switching capacitor to the inverting input of the first operational amplifier when the third switching means is at a second position.

Preferably, the switch of the first switching means is synchronized with the switch of the third switching means and the position of the first switching means is opposite to the position of the third switching means.

Preferably, when the first switching means is at the first position and the third switching means is at the second position, the first capacitor is charged by the power source and the second capacitor is discharged to pump all charges on the second capacitor into the piezoelectric actuator; and when the first switching means is at the second position and the third switching means is at the first position, the first capacitor is discharged to pump all charges on the first capacitor into the piezoelectric actuator and the second capacitor is charged by the power source.

Preferably, the power source includes:
a second operational amplifier, the output terminal of the second operational amplifier being connected to the inverting input terminal of the second operational amplifier;
a reference voltage source connected between the non-inverting input terminal of the second operational amplifier and the ground;
a fourth capacitor connected to the inverting input terminal of the second operational amplifier via a fourth switching means; and
the fourth switching means connected between the fourth capacitor and the inverting input terminal of the second operational amplifier.

Preferably, the piezoelectric actuating circuit includes a third operational amplifier, the non-inverting input terminal thereof being connected to the piezoelectric actuator, the inverting input terminal thereof being connected with the output terminal thereof; and the piezoelectric actuator connected between the non-inverting input terminal and ground.

Preferably, the power source includes:
a positive voltage source for providing a positive voltage;
a negative voltage source for providing a negative voltage;
a fourth operational amplifier, the non-inverting input terminal thereof being connected to a seventh switching means, the inverting input terminal thereof being connected with the output terminal thereof; and
the seventh switching means being connected the positive voltage source to the non-inverting input terminal of the fourth operational amplifier to supply a positive voltage to the first switching capacitor when the seventh switching means is at a first position, and being connected to the non-inverting input terminal of the fourth operational amplifier to supply a negative voltage to the first switching capacitor when the seventh switching means is at a second position.

Preferably, the first switching capacitor includes:
a fifth switching means and a sixth switching means configured to process the switch synchronously; and
a fourth capacitor connected between the fifth switching means and the sixth switching means,
wherein when the first switching capacitor is at the first state, both the fifth switching means and the sixth switching means are at a first position, a terminal of the fourth capacitor is connected to the inverting input of the fourth operational amplifier in a power source, another terminal of the fourth capacitor is connected to ground; and when the first switching capacitor is at the second state, both the fifth switching means and the sixth switching means are at a second position and the fourth capacitor is connected between the inverting input and non-inverting input of the first operational amplifier.

In another aspect of the present application, a method for driving piezoelectric actuator by a switched capacitor charge pump is provided. The method includes the following steps:
charging a first switching capacitor by a power source when the first switching capacitor is at a first state; and
discharge from the first switching capacitor to pump all charges thereon into the piezoelectric actuator when the first switching capacitor is at a second state.

Preferably, the piezoelectric actuating circuit includes:
a first operational amplifier, the non-inverting input terminal thereof being connected to ground; and
a piezoelectric actuator connected between the inverting input terminal and the output terminal of the first operational amplifier.

Preferably, the first switching capacitor includes:
a first switching means; and
a first capacitor connected between the first switching means and the ground,
wherein when the first switching capacitor is at the first state, the first switching means is at a first position and connects the first capacitor to a power source; and when the first switching capacitor is at the second state, the first switching means is at a second position and connects the first capacitor to the inverting input of the first operational amplifier.

Preferably, the power source includes:
a positive voltage source for providing a positive voltage ;
a negative voltage source for providing a negative voltage ; and
a second switching means connected the positive voltage source to the first switching capacitor when the second switching means is at a first position, and connected the negative voltage source to the first switching capacitor when the second switching means is at a second position.

Preferably, the method may further include: providing a second switching capacitor in parallel with the first switching capacitor.

Preferably, the second switching capacitor includes:
a third switching means; and
a second capacitor connected between the third switching means and the ground,
wherein a third switching means connects the second switching capacitor to the power source when the third switching means is at a first position, and connects the second switching capacitor to the inverting input of the first operational amplifier when the third switching means is at a second position.

Preferably, the switch of the first switching means is synchronized with the switch of the third switching means and the position of the first switching means is opposite to the position of the third switching means.

Preferably, when the first switching means is at the first position and the third switching means is at the second position, the first capacitor is charged by the power source and the second capacitor is discharged to pump all charges on the second capacitor into the piezoelectric actuator; and when the first switching means is at the second position and the third switching means is at the first position, the first capacitor is discharged to pump all charges on the first capacitor into the piezoelectric actuator and the second capacitor is charged by the power source.

Preferably, the power source includes:

a second operational amplifier, the output terminal of the second operational amplifier being connected to the inverting input terminal of the second operational amplifier;

a reference voltage source connected between the non-inverting input terminal of the second operational amplifier and the ground;

a fourth capacitor connected to the inverting input terminal of the second operational amplifier via a fourth switching means; and the fourth switching means connected between the fourth capacitor and the inverting input terminal of the second operational amplifier.

Preferably, the piezoelectric actuating circuit includes:

a third operational amplifier, the non-inverting input terminal thereof being connected to the piezoelectric actuator, the inverting input terminal thereof being connected with the output terminal thereof; and the piezoelectric actuator connected between the non-inverting input terminal and ground.

Preferably, the power source includes:

a positive voltage source for providing a positive voltage;

a negative voltage source for providing a negative voltage;

a fourth operational amplifier, the non-inverting input terminal thereof being connected to a seventh switching means, the inverting input terminal thereof being connected with the output terminal thereof; and the seventh switching means being connected the positive voltage source to the non-inverting input terminal of the fourth operational amplifier to supply a positive voltage to the first switching capacitor when the seventh switching means is at a first position, and being connected to the non-inverting input terminal of the fourth operational amplifier to supply a negative voltage to the first switching capacitor when the seventh switching means is at a second position.

Preferably, the first switching capacitor includes:

a fifth switching means and a sixth switching means configured to process the switch synchronously; and a fourth capacitor connected between the fifth switching means and the sixth switching means, wherein when the first switching capacitor is at the first state, both the fifth switching means and the sixth switching means are at a first position, a terminal of the fourth capacitor is connected to the inverting input of the fourth operational amplifier in a power source, another terminal of the fourth capacitor is connected to ground; and when the first switching capacitor is at the second state, both the fifth switching means and the sixth switching means are at a second position and the fourth capacitor is connected between the inverting input and non-inverting input of the first operational amplifier.

The switched capacitor charge pump driver for piezoelectric actuator according to the present application is provided to expand the application of charge controller to a broader frequency range, especially at low frequencies. It transmitted the same amount of charges to the piezoelectric actuators step by step, and realized the linear charge exerted on the actuator. It has a sample structure and the cycle of actuator displacement relates to the frequency of the switches, the capacitance of the capacitor, and the amplitude of voltage source. Thus, it can be changed easily by adjusting these factors, avoiding the complexity and instability presented in some other control methods. In addition, the dielectric absorption of the capacitor had no influence on the performance of the controller. In comparison with traditional voltage and charge driving, the charge pump driver according to the present application can effectively decrease the hysteresis of piezoelectric stack over a large frequency range even at a quasistatic state. Besides, the step response of the stack displacement is excellent. A higher displacement resolution can be achieved for precision control by driving the piezoelectric actuator with a charge pump.

DETAILED DESCRIPTION OF THE INVENTION

In order that the purpose, features and advantages of the present invention can be more apparent and be better understood, in the following, embodiments of the present invention will be described in further detail in conjunction with the accompanying drawings and the preferred embodiments.

Figure 2A:
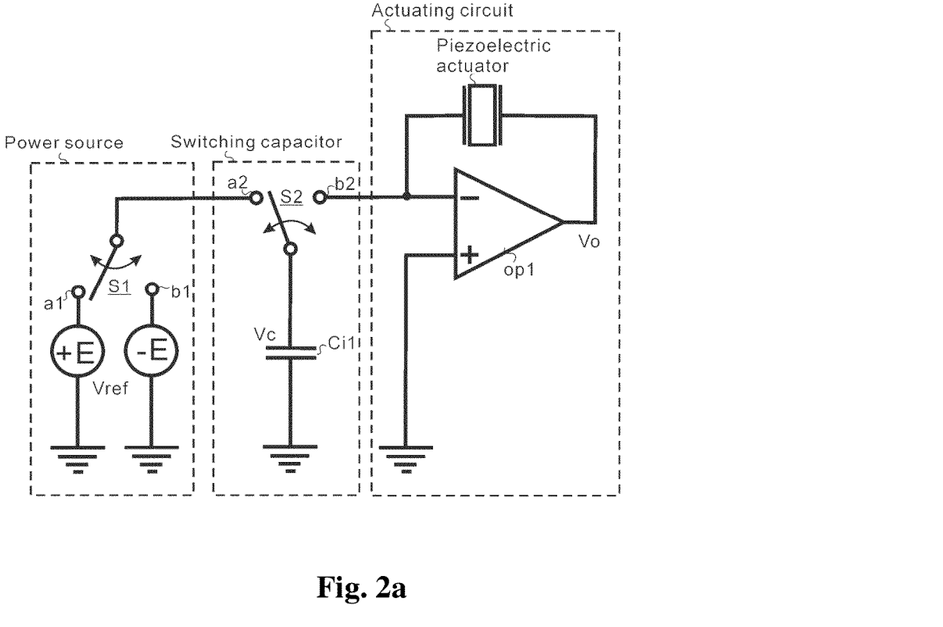
FIG 2a shows a diagram of a switched capacitor charge pump driver for piezoelectric actuator according to a first embodiment of the present application.
Figure 2B:
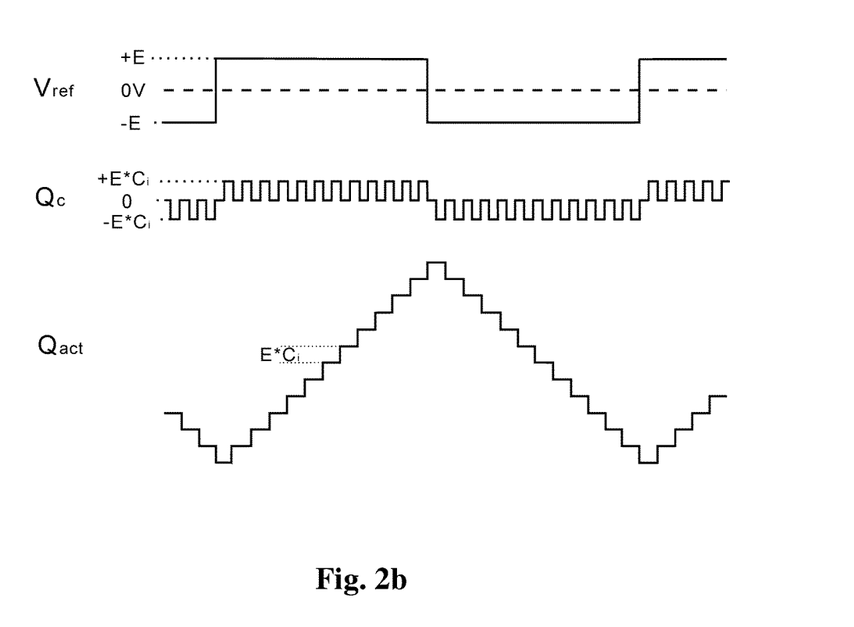
FIG 2b shows a graph of charge change on the capacitor and the actuator in switched capacitor charge pump driver for piezoelectric actuator according to the first embodiment of the present application.

FIG 2a shows a diagram of a switched capacitor charge pump driver for piezoelectric actuator according to a first embodiment of the present application. FIG 2b shows a graph of charge change on the capacitor and the actuator in switched capacitor charge pump driver for piezoelectric actuator according to the first embodiment of the present application.

As shown in FIG 2a, the switched capacitor charge pump driver according to a first embodiment of the present application may include a power source, a first switching capacitor and a piezoelectric actuating circuit, wherein when being at a first state, the first switching capacitor is connected with the power source and charged by the power source; and when being at a second state, the first switching capacitor is connected with the integrator circuit and discharged to the piezoelectric actuator.

The piezoelectric actuating circuit can include a first operational amplifier, the non-inverting input terminal thereof being connected to ground; and a piezoelectric actuator connected between the inverting input terminal and the output terminal of the first operational amplifier. The first switching capacitor can include a first switching means; and a first capacitor connected between the first switching means and the ground, wherein when the first switching capacitor is at the first state, the first switching means is at a first position and connects the first capacitor to a power source; and when the first switching capacitor is at the second state, the first switching means is at a second position and connects the first capacitor to the inverting input of the first operational amplifier. The power source can includes a positive voltage source for providing a positive voltage; a negative voltage source for providing a negative voltage; and a second switching means connected the positive voltage source to the first capacitor when the second switching means is at a first position, and connected the negative voltage source to the first capacitor when the second switching means is at a second position.

In particular, the capacitor $C_{i1}$ is charged through a positive voltage source when the switch S1 is connected to pole a1 and the switch S2 is connected to pole a2. When the switch S2 is connected to pole b2, all the charges on the capacitor $C_{i1}$ will be pumped into the piezoelectric actuator. The actuator will then produce a small displacement during the transfer process. Switch S2 reconnects to pole a2 to be charged. The actuator will remain steady at the interval when $C_{i1}$ is switched away from the inverting input terminal of the amplifier. When switch S2 reconnects to pole b2, the charges are pumped into the actuator again. The switching between poles a2 and b2 of the switch S2 is repeated until the actuator reaches the required displacement.

Similarly, a negative voltage source can provide negative charges when the switch S1 is connected to pole b1 and the switch S2 is connected to pole a2. When the switch S2 is connected to pole b2, all the charges on the capacitor $C_{i1}$ will be pumped into the piezoelectric actuator. The actuator will then produce a small reverse displacement during the transfer process. The afore-mentioned process is repeated until the actuator reaches the required displacement.

When the switch S1 is connected to the reference voltage +E, the capacitor $C_{i1}$ is charged, and $$Q_c = C_{i1} E \quad (6)$$

then the Ci1 is disconnected from the voltage source and connected with the inverting input terminal of the amplifier $OP_1$. The charges on the capacitor Ci will be pumped into the piezoelectric actuator rapidly as $$\Delta Q_{act} = C_{i1} E \quad (7)$$

After t seconds or N cycles, the total charges on the actuator will be $$\begin{aligned} Q_{act} &= \Delta Q_{act} + \Delta Q_{act} + \ldots + \Delta Q_{act} \\ &= tf \Delta Q_{act} \\ &= NC_i E \ (N = tf), \end{aligned} \quad (8)$$

where f is the working frequency of the switch S2, E is the value of voltage source and $C_{i1}$ is the value of the capacitor $C_{i1}$. The changing rate of the displacement of the actuator is directly proportional to the values of the voltage source, the capacitance of the capacitor, and the frequency of switch S2, as shown in FIG 2.

By adjusting the value of capacitor $C_{i1}$ and voltage source, the height of every displacement step can be regulated to achieve the required resolution in precise positioning. In many control methodologies using a computer or microchip, such as digital signal processor and single chip microcontroller, digital-to-analog converter (DAC) are usually needed in the driving circuit. Supposing the manipulation signal comes from a 16 bit DAC, the theoretically smallest voltage step is $V/2^{16}$, where V is the maximum voltage exerted on the actuator. In the charge pump control circuit, if $C_i = C_{act}/10000$, E=V/100, the step of the actuating voltage can reach $V/10^6$, which has a resolution 15 times higher than those of the control circuits with the 16 bit DAC.

As can be seen from above, each operation period of the actuator includes a charging process and a state keeping process. At low frequencies, the charging process is much shorter than the state-keeping process. As the actuator has leakage current and the operational amplifier has a bias current during work, the displacement of the actuator may drift away in the long state-keeping process. An auxiliary circuit can be adopted to maintain a steady actuator voltage during the state-keeping process, the effects of the leakage and bias currents can be eliminated, and the working frequency can be expanded to almost DC.

Figure 3:
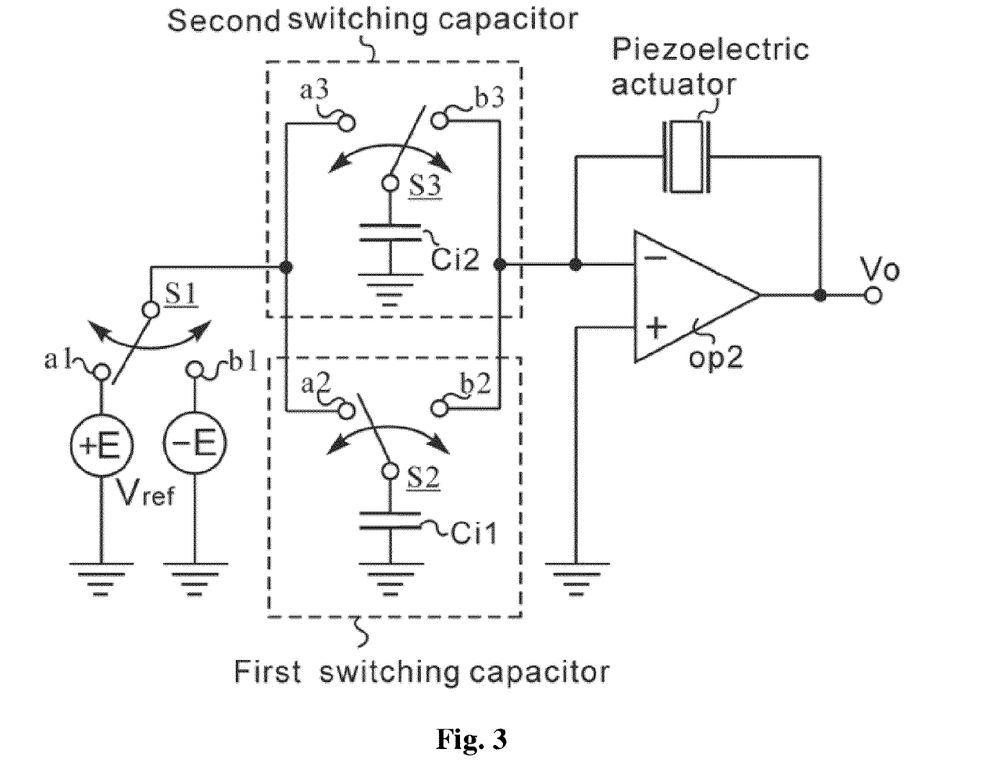
FIG 3 shows a diagram of a switched capacitor charge pump driver for piezoelectric actuator according to a second embodiment of the present application.

In FIG 3, a diagram of a switched capacitor charge pump driver for piezoelectric actuator according to a second embodiment of the present application is provided. A difference between the present embodiment and the first embodiment is that a second switching capacitor is provided in parallel with the first switching capacitor.

In particular, as shown in FIG 3, the arrangement of the second switching capacitor is the same with that of the first switching capacitor. The second switching capacitor includes a third switching means S3; and a second capacitor $C_{i2}$ connected between the third switching means S3 and the ground, wherein the third switching means S3 connects the second capacitor $C_{i2}$ to the power source when the third switching means S3 is at a first position a3, and connects the second capacitor $C_{i2}$ to the inverting input of the first operational amplifier when the third switching means S3 is at a second position b3. The switch of the first switching means S2 is synchronized with the switch of the third switching means S3 and the position of the first switching means S2 is opposite to the position of the third switching means S3.

When the first switching means S2 is at the first position a2 and the third switching means S3 is at the second position b3, the first capacitor $C_{i1}$ is charged by the power source and the second capacitor $C_{i2}$ is discharged to pump all charges on the second capacitor $C_{i2}$ into the piezoelectric actuator; and when the first switching means S2 is at the second position b2 and the third switching means S3 is at the first position a3, the first capacitor $C_{i1}$ is discharged to pump all charges on the first capacitor $C_{i1}$ into the piezoelectric actuator and the second capacitor $C_{i2}$ is charged by the power source. The velocity of driving the piezoelectric actuator according to this embodiment is twice as fast as that according to the first embodiment, so as to obtain an almost continuous current.

Figure 4:
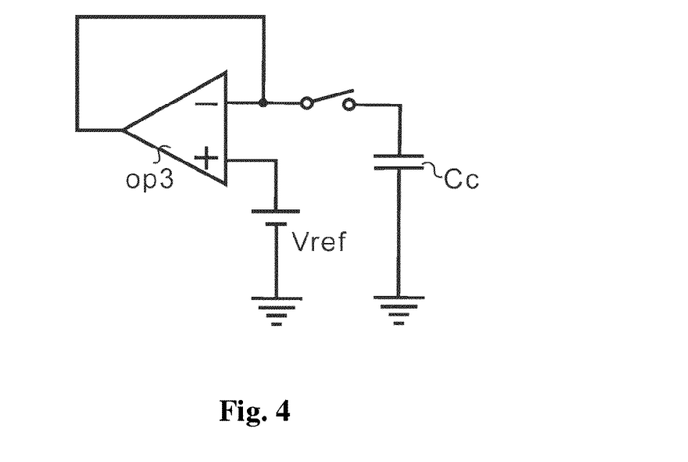
FIG 4 shows a graph of another power source according the present application.

In addition, as shown in FIG 4, an alternative power source is provided. Normally, the reference voltage has a very high internal impedance, and so it can only supply a very low current to the load. Supposing the internal resistance of the reference voltage Vref is r, and the conducting resistance of the switch is R, here r>>R, so switching time without the operational amplifier is $\tau1 = Cc(r+R)$, the time with operational amplifier is $\tau2 = CcR$. This circuit will reduce the charging time to a very small value ($\tau2 \ll \tau1$).

Figure 5:
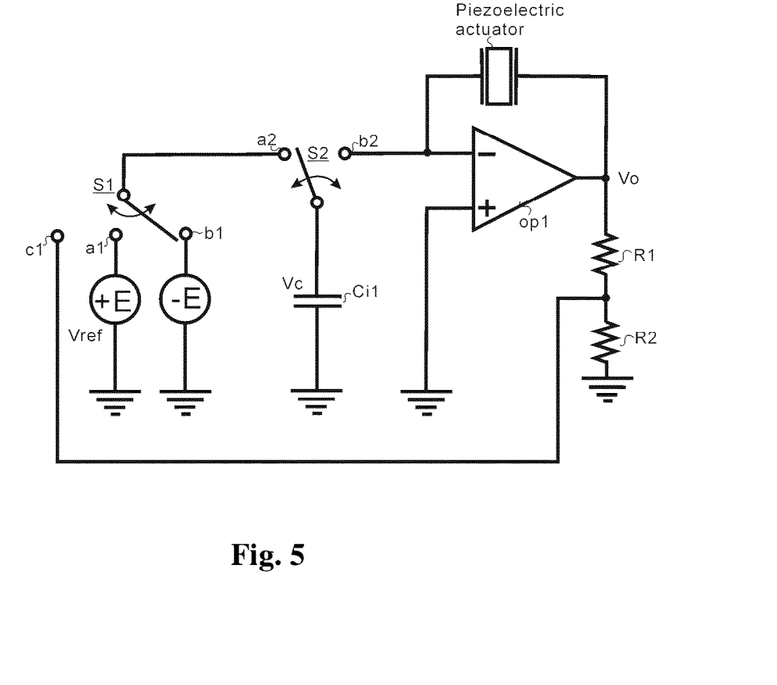
FIG 5 shows a diagram of a switched capacitor charge pump driver for piezoelectric actuator incorporated with an auto-zero circuit according to a first embodiment of the present application.

FIG 5 shows a diagram of a switched capacitor charge pump driver for piezoelectric actuator incorporated with an auto-zero circuit according to a first embodiment of the present application. In respect of the auto-zero circuit as shown in FIG 5, a resistive voltage divider composed by R1 and R2 is connected to the output of the amplifier; a wire led out the connection between R1 and R2 is extended to switch S1 to function as a pole c1 of the switch S1. When the switch S1 is connected with pole c1, the charges on the actuator will be reduced to null by switching the switch 21 between the poles 22 and 23 several cycles. This function can be used to set a start point of the piezoelectric actuator.

Figure 6:
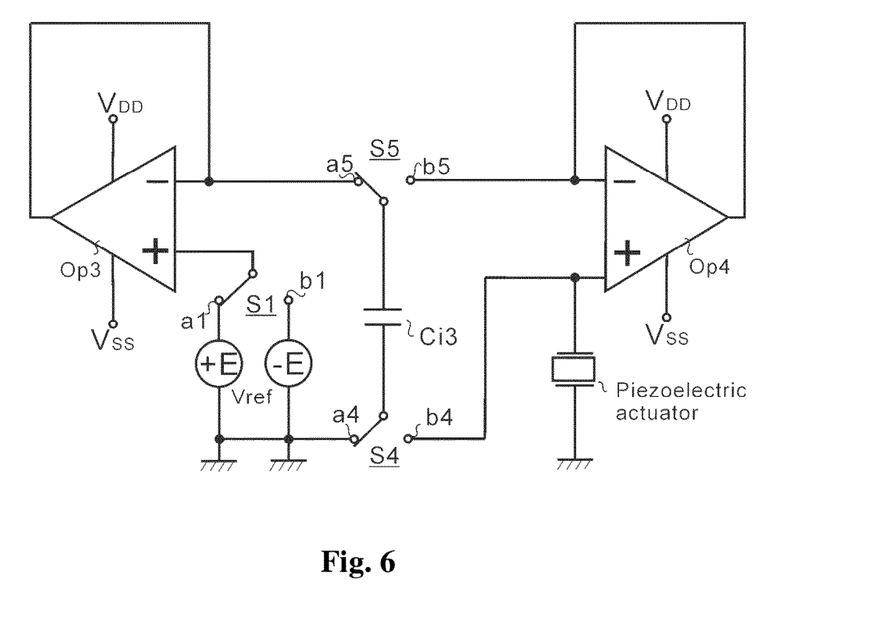
FIG 6 shows a diagram of a switched capacitor charge pump driver for piezoelectric actuator according to a third embodiment of the present application.

FIG 6 shows a diagram of a switched capacitor charge pump driver for piezoelectric actuator according to a third embodiment of the present application.

Normally, the piezoelectric actuator is difficult to be floating driven by the circuit as shown in FIG 2a or FIG 3, and at these circumstances, an alternative circuit dealing with grounded piezoelectric actuator should be used, as shown in FIG 6. In the present embodiment, the piezoelectric actuator includes a first capacitor, a power source and a piezoelectric actuating circuit.

Particularly, the piezoelectric actuating circuit according to the embodiment of the present application includes a third operational amplifier, the non-inverting input terminal thereof being connected to the piezoelectric actuator, the inverting input terminal thereof being connected with the output terminal thereof; and the piezoelectric actuator connected between the non-inverting input terminal and ground. The power source according to the embodiment of the present application comprises: a positive voltage source for providing a positive voltage; a negative voltage source for providing a negative voltage; a fourth operational amplifier, the non-inverting input terminal thereof being connected to a seventh switching means, the inverting input terminal thereof being connected with the output terminal thereof; and the seventh switching means being connected the positive voltage source to the non-inverting input terminal of the fourth operational amplifier to supply a positive voltage to the first switching capacitor when the seventh switching means is at a first position, and being connected to the non-inverting input terminal of the fourth operational amplifier to supply a negative voltage to the first switching capacitor when the seventh switching means is at a second position. The first switching capacitor according to the embodiment of the present application includes a fifth switching means and a sixth switching means provided at both ends of the capacitor respectively and configured to process the switch synchronously; and a fourth capacitor connected between the fifth switching means and the sixth switching means, wherein when the first switching capacitor is at the first state, both the fifth switching means and the sixth switching means are at a first position, a terminal of the fourth capacitor is connected to the inverting input of the fourth operational amplifier in a power source, another terminal of the fourth capacitor is connected to ground; and when the first switching capacitor is at the second state, both the fifth switching means and the sixth switching means are at a second position and the fourth capacitor is connected between the inverting input and non-inverting input of the first operational amplifier.

Supposing that both the piezoelectric actuator and input capacitor $C_{i3}$ are initially discharged. The non-inverting input terminal of Op4 is connected to a positive voltage source. When the switch S4 is connected to the pole a4 and switch S5 is connected to the pole a5, the capacitor Cs is charged by the positive voltage source. The Op4 facilitates rapid charging of the capacitor $C_o$. When the switch S4 is connected to the pole b4 and switch S5 is connected to the pole b5, electric potential difference appear between the non-inverting and inverting input of Op4 (caused by voltage on the capacitor $C_{i3}$). In order to compensate the difference, Op4 will output large current pulse to balance the charges on the capacitor $C_{i3}$, and charge the piezoelectric actuator at the same time. The actuator will then produce a small displacement during the charging process. So we call the charges on the capacitor $C_{i3}$ is transferred into the piezoelectric actuator. After that, Switch S4 and S5 reconnect to the poles a4 and a5 to charge the capacitor. The actuator will remain steady during this period until being charged again. The charges are transferred into the actuator with constant step over and over again until the actuator reaches the required displacement. Then the non-inverting input of Op4 is connected to a negative voltage source. By repeating the same switching process, the actuator is discharged step by step.

Figure 7:
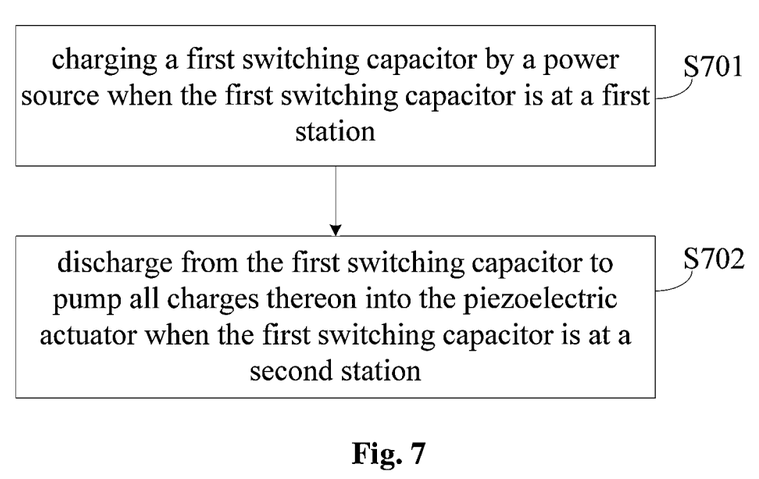
FIG 7 shows a flow chart of a method for driving piezoelectric actuator by a switched capacitor charge pump according to the present application.

As shown in FIG 7, a method for driving piezoelectric actuator by a switched capacitor charge pump according to the present application includes the following steps:

S701, charging a first switching capacitor by a power source when the first switching capacitor is at a first state;

The first switching capacitor includes a first switching means and a first capacitor connected between the first switching means and ground. When the first switching capacitor is at the first state, the first switching means is at a first position and connects the first capacitor to a power source to charge the first capacitor.

Alternatively, a second switching capacitor is provided in parallel with the first switching capacitor. The second switching capacitor includes a third switching means and a second capacitor connected between the third switching means and the ground. The switch of the first switching means is synchronized with the switch of the third switching means and the position of the first switching means is opposite to the position of the third switching means. That is to say, when the first switching means is at the first position and the third switching means is at the second position, the first capacitor is charged by the power source.

In addition, in the third embodiment referred to FIG 6, when the first switching capacitor is at the first state, i.e., both the fifth switching means and the sixth switching means are at a first position, a terminal of the fourth capacitor is connected to the inverting input of the fourth operational amplifier in a power source, and another terminal of the fourth capacitor is connected to ground. By this way, the fourth capacitor is charged by the power source.

S702, discharge from the first capacitor to pump all charges on the first capacitor into the piezoelectric actuator when the first switching capacitor is at a second state.

Particularly, when the first switching capacitor is at the second state, the first switching means is at a second position and connects the first capacitor to the inverting input of the first operational amplifier, so as to provide the charges on the first capacitor to the piezoelectric actuator.

Alternatively, in the case of the second switching capacitor being provided, when the first switching means is at the second position and the third switching means is at the first position, the first capacitor is discharged to pump all charges thereon into the piezoelectric actuator and the second capacitor is charged by the power source.

In addition, in the third embodiment referred to FIG 6, when the first switching capacitor is at the second state, i.e., both the fifth switching means and the sixth switching means are at a second position and the fourth capacitor is connected between the inverting input and non-inverting input of the first operational amplifier. By this way, the fourth capacitor is discharged to pump all charges thereon into the piezoelectric actuator.

It should be noted that the relationship terminologies such as first and second and the like are only used herein to distinguish an entity or operation from another entity or operation, and it is not necessarily required or implied that there are any actual relationship or order of this kind between those entities and operations. Moreover, the terminologies of 'comprise', 'include' and any other variants are intended to cover the non-exclusive inclusions so that the processes, methods, articles or equipment including a series of elements not only include those elements but also include other elements that are not listed definitely or the elements inherent in the processes, methods, articles or equipment. In the case of no more restrictions, the elements defined by the statement 'include one . . . ' do not exclude that other same elements also exist in the processes, methods, articles or equipment including the elements.

Only the better embodiments of the present invention are described above, which are not intended to define the scope of protection of the present invention. Any changes, equivalent substitution, improvement and so on made within the spirit and principles of the present invention are all contained in the scope of protection of the present invention.

The invention claimed is:

1. A switched capacitor charge pump driver for piezoelectric actuator, comprising a power source, a first switching capacitor and a piezoelectric actuating circuit, wherein
    when being at a first state, the first switching capacitor is connected with the power source and charged by the power source; and when being at a second state, the first switching capacitor is connected with the piezoelectric actuating circuit and discharged to the piezoelectric actuating circuit,
    wherein the piezoelectric actuating circuit comprises:
    an operational amplifier of the piezoelectric actuating circuit, the non-inverting input terminal thereof being connected to the piezoelectric actuator, the inverting input terminal thereof being connected with the output terminal thereof; and
    the piezoelectric actuator connected between the non-inverting input terminal of the operational amplifier of the piezoelectric actuating circuit and ground.

2. The switched capacitor charge pump driver according to claim 1, wherein the piezoelectric actuating circuit comprises:
    a first operational amplifier, the non-inverting input terminal thereof being connected to ground; and
    a piezoelectric actuator connected between the inverting input terminal and the output terminal of the first operational amplifier.

3. The switched capacitor charge pump driver according to claim 2, wherein the first switching capacitor comprises:
    a first switching means; and
    a first capacitor connected between the first switching means and the ground,
    wherein when the first switching capacitor is at the first state, the first switching means is at a first position and connects the first capacitor to the power source; and when the first switching capacitor is at the second state, the first switching means is at a second position and connects the first capacitor to the inverting input of the first operational amplifier.

4. The switched capacitor charge pump driver according to claim 1, wherein the power source comprises:
    a positive voltage source for providing a positive voltage;
    a negative voltage source for providing a negative voltage; and
    a second switching means connected the positive voltage source to the first switching capacitor when the second switching means is at a first position, and connected the negative voltage source to the first switching capacitor when the second switching means is at a second position.

5. The switched capacitor charge pump driver according to claim 4, further comprising a second switching capacitor in parallel with the first switching capacitor.

6. The switched capacitor charge pump driver according to claim 5, wherein the second switching capacitor comprises:
    a third switching means; and
    a second capacitor connected between the third switching means and the ground,
    wherein the third switching means connects the second switching capacitor to the power source when the third switching means is at a first position, and connects the second switching capacitor to the inverting input of the first operational amplifier when the third switching means is at a second position.

7. The switched capacitor charge pump driver according to claim 6, wherein the switch of the first switching means is synchronized with the switch of the third switching means and the position of the first switching means is opposite to the position of the third switching means.

8. The switched capacitor charge pump driver according to claim 7, wherein
    when the first switching means is at the first position and the third switching means is at the second position, the first capacitor is charged by the power source and the second capacitor is discharged to pump all charges on the second capacitor into the piezoelectric actuator; and
    when the first switching means is at the second position and the third switching means is at the first position, the first capacitor is discharged to pump all charges on the first capacitor into the piezoelectric actuator and the second capacitor is charged by the power source.

9. The switched capacitor charge pump driver according to claim 1, wherein the power source comprises:
    a second operational amplifier, the output terminal thereof being connected to the inverting input terminal of the second operational amplifier;
    a reference voltage source connected between the non-inverting input terminal of the second operational amplifier and ground;
    a third capacitor connected to the inverting input terminal of the second operational amplifier via a fourth switching means; and
    the fourth switching means connected between the third capacitor and the inverting input terminal of the second operational amplifier.

10. The switched capacitor charge pump driver according to claim 1, wherein the power source comprises:
    a positive voltage source for providing a positive voltage;
    a negative voltage source for providing a negative voltage;
    a fourth operational amplifier, the non-inverting input terminal thereof being connected to a seventh switching means, the inverting input terminal thereof being connected with the output terminal thereof; and
    the seventh switching means being connected the positive voltage source to the non-inverting input terminal of the fourth operational amplifier to supply a positive voltage to the first switching capacitor when the seventh switching means is at a first position, and being connected to the non-inverting input terminal of the fourth operational amplifier to supply a negative voltage to the first switching capacitor when the seventh switching means is at a second position.

11. The switched capacitor charge pump driver according to claim 10, wherein the first switching capacitor comprises:
a fifth switching means and a sixth switching means configured to process the switch synchronously; and
a fourth capacitor connected between the fifth switching means and the sixth switching means,
wherein when the first switching capacitor is at the first state, both the fifth switching means and the sixth switching means are at a first position, a terminal of the fourth capacitor is connected to the inverting input of the fourth operational amplifier in a power source, another terminal of the fourth capacitor is connected to ground; and when the first switching capacitor is at the second state, both the fifth switching means and the sixth switching means are at a second position and the fourth capacitor is connected between the inverting input and non-inverting input of the first operational amplifier.

12. A method for driving piezoelectric actuator by a switched capacitor charge pump, comprising:
charging a first switching capacitor by a power source when the first switching capacitor is at a first state; and
discharge from the first switching capacitor to pump all charges thereon into a piezoelectric actuating circuit when the first switching capacitor is at a second state,
wherein the piezoelectric actuating circuit comprises:
an operational amplifier of the piezoelectric actuating circuit, the non-inverting input terminal thereof being connected to the piezoelectric actuator, the inverting input terminal thereof being connected with the output terminal thereof;
the piezoelectric actuator connected between the non-inverting input terminal of the operational amplifier of the piezoelectric actuating circuit and ground; and
the discharge from the first switching capacitor to pump all charges thereon into a piezoelectric actuating circuit when the first switching capacitor is at a second state comprises:
connecting the first switching capacitor between the non-inverting input terminal and the inverting input terminal of the operational amplifier of the piezoelectric actuating circuit, when the first switching capacitor is at a second state ; and
discharge to the piezoelectric actuating circuit, by the first switching capacitor.

13. The method for driving piezoelectric actuator by a switched capacitor charge pump according to the claim 12, wherein the piezoelectric actuating circuit comprises:
a first operational amplifier, the non-inverting input terminal thereof being connected to ground; and
a piezoelectric actuator connected between the inverting input terminal and the output terminal of the first operational amplifier.

14. The method for driving piezoelectric actuator by a switched capacitor charge pump according to the claim 13, wherein the first switching capacitor comprises:
a first switching means; and
a first capacitor connected between the first switching means and ground,
wherein when the first switching capacitor is at the first state, the first switching means is at a first position and connects the first capacitor to the power source; and when the first switching capacitor is at the second state, the first switching means is at a second position and connects the first capacitor to the inverting input of the first operational amplifier.

15. The method for driving piezoelectric actuator by a switched capacitor charge pump according to the claim 12, wherein the power source comprises:
a positive voltage source for providing a positive voltage;
a negative voltage source for providing a negative voltage; and
a second switching means connected the positive voltage source to the first switching capacitor when the second switching means is at a first position, and connected the negative voltage source to the first switching capacitor when the second switching means is at a second position.

16. The method for driving piezoelectric actuator by a switched capacitor charge pump according to the claim 14, further comprising:
providing a second switching capacitor in parallel with the first switching capacitor.

17. The method for driving piezoelectric actuator by a switched capacitor charge pump according to the claim 16, wherein the second switching capacitor comprises:
a third switching means; and
a second capacitor connected between the third switching means and the ground,
wherein a third switching means connects the second switching capacitor to the power source when the third switching means is at a first position, and connects the second switching capacitor to the inverting input of the first operational amplifier when the third switching means is at a second position.

18. The method for driving piezoelectric actuator by a switched capacitor charge pump according to the claim 17, wherein the switch of the first switching means is synchronized with the switch of the third switching means and the position of the first switching means is opposite to the position of the third switching means.

19. The method for driving piezoelectric actuator by a switched capacitor charge pump according to the claim 18, wherein
when the first switching means is at the first position and the third switching means is at the second position, the first capacitor is charged by the power source and the second capacitor is discharged to pump all charges on the second capacitor into the piezoelectric actuator; and
when the first switching means is at the second position and the third switching means is at the first position, the first capacitor is discharged to pump all charges on the first capacitor into the piezoelectric actuator and the second capacitor is charged by the power source.

20. The method for driving piezoelectric actuator by a switched capacitor charge pump according to the claim 12, wherein the power source comprises:
a second operational amplifier, the output terminal of the second operational amplifier being connected to the inverting input terminal of the second operational amplifier;
a reference voltage source connected between the non-inverting input terminal of the second operational amplifier and the ground;
a third capacitor connected to the inverting input terminal of the second operational amplifier via a fourth switching means; and the fourth switching means connected between the fourth capacitor and the inverting input terminal of the second operational amplifier.

21. The method for driving piezoelectric actuator by a switched capacitor charge pump according to the claim 12, wherein the power source comprises:

a positive voltage source for providing a positive voltage;

a negative voltage source for providing a negative voltage;

a fourth operational amplifier, the non-inverting input terminal thereof being connected to a seventh switching means, the inverting input terminal thereof being connected with the output terminal thereof; and the seventh switching means being connected the positive voltage source to the non-inverting input terminal of the fourth operational amplifier to supply a positive voltage to the first switching capacitor when the seventh switching means is at a first position, and being connected to the non-inverting input terminal of the fourth operational amplifier to supply a negative voltage to the first switching capacitor when the seventh switching means is at a second position.

22. The method for driving piezoelectric actuator by a switched capacitor charge pump according to the claim 21, wherein the first switching capacitor comprises:

a fifth switching means and a sixth switching means configured to process the switch synchronously; and a fourth capacitor connected between the fifth switching means and the sixth switching means, wherein when the first switching capacitor is at the first state, both the fifth switching means and the sixth switching means are at a first position, a terminal of the fourth capacitor is connected to the inverting input of the fourth operational amplifier in a power source, another terminal of the fourth capacitor is connected to ground; and when the first switching capacitor is at the second state, both the fifth switching means and the sixth switching means are at a second position and the fourth capacitor is connected between the inverting input and non-inverting input of the first operational amplifier.

* * * * *